(12) United States Patent
Yan et al.

(10) Patent No.: US 11,201,598 B2
(45) Date of Patent: Dec. 14, 2021

(54) VOLUME ADJUSTING METHOD AND MOBILE TERMINAL

(71) Applicant: GUANGDONG OPPO MOBILE TELECOMMUNICATIONS CORP., LTD., Guangdong (CN)

(72) Inventors: Fenggui Yan, Guangdong (CN); Zhaoan Xu, Guangdong (CN); Zhiyong Zheng, Guangdong (CN); Gaoting Gan, Guangdong (CN); Hai Yang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/790,103

(22) Filed: Feb. 13, 2020

(65) Prior Publication Data
US 2020/0186113 A1 Jun. 11, 2020

Related U.S. Application Data

(63) Continuation of application No. PCT/CN2017/098177, filed on Aug. 18, 2017.

(51) Int. Cl.
   *H03G 3/24* (2006.01)
   *H03G 9/14* (2006.01)
   *H04R 5/04* (2006.01)

(52) U.S. Cl.
   CPC ............. *H03G 3/24* (2013.01); *H03G 9/14* (2013.01); *H04R 5/04* (2013.01); *H04R 2430/01* (2013.01)

(58) Field of Classification Search
   CPC ........ H03G 3/24; H03G 9/14; H04R 2430/01; H04R 5/04
   (Continued)

(56) References Cited

U.S. PATENT DOCUMENTS

2009/0132242 A1   5/2009   Wang et al.
2018/0097493 A1   4/2018   Weksler et al.

FOREIGN PATENT DOCUMENTS

CN   1783928      6/2006
CN   101026363    8/2007
(Continued)

OTHER PUBLICATIONS

SIPO, First Office Action for CN Application No. 201780093964.7, dated Jan. 5, 2021.
(Continued)

*Primary Examiner* — Paul Kim
(74) *Attorney, Agent, or Firm* — Hodgson Russ LLP

(57) ABSTRACT

The embodiment of the disclosure provides a volume adjusting method and device, a mobile terminal and a storage medium. The method includes: acquiring first audio information corresponding to an audio source when detecting that the audio source of a terminal device is playing; determining a first audio amplitude of the first audio information; determining a second audio amplitude of second audio information when the first audio amplitude meets a preset query condition, wherein the second audio information is played after the first audio information; determining corresponding adjustment information when the second audio amplitude meets a preset adjustment condition; and adjusting a volume of the terminal device according to the adjustment information. The disclosure improves the volume adjustment efficiency and reduces the energy consumption of the terminal device.

20 Claims, 4 Drawing Sheets

(58) Field of Classification Search
USPC .......................................................... 381/57
See application file for complete search history.

(56) References Cited

FOREIGN PATENT DOCUMENTS

| | | | | |
|---|---|---|---|---|
| CN | 101026363 | 12/2010 | | |
| CN | 103209370 | 7/2013 | | |
| CN | 103456332 | 12/2013 | | |
| CN | 104485911 | 4/2015 | | |
| CN | 106325807 | 1/2017 | | |
| CN | 106328111 | 1/2017 | | |
| GB | 2351881 | 1/2001 | | |
| GB | 2351881 A * | 1/2001 | ............. | H03G 3/001 |
| GB | 2351881 | 6/2001 | | |

OTHER PUBLICATIONS

EPO, Communication for EP Application No. 17921634.6, dated Mar. 17, 2021.
WIPO, ISR for PCT/CN2017/098177, Nov. 29, 2017.
EPO, Office Action for EP Application No. 17921634.6, dated Jul. 10, 2020.
CNIPA, Second Office Action for CN Application No. 201780093964.7, dated Jul. 29, 2021.
EPO, Communication for EP Application No. 17921634.6, dated Sep. 20, 2021.

* cited by examiner

VOLUME ADJUSTING METHOD AND MOBILE TERMINAL

CROSS REFERENCE TO RELATED APPLICATION

This application is a continuation of International Application No. PCT/CN2017/098177, filed on Aug. 18, 2017, the entire disclosure of which is incorporated herein by reference.

TECHNICAL FIELD

The present disclosure relates to the field of computer technologies, and more particular, to a volume adjusting method and device, a mobile terminal and a storage medium.

BACKGROUND

With the increasing popularity of mobile terminals, the mobile terminals are used by more and more users to perform various functions to meet their respective needs. For instances, the mobile terminals are used to read text, watch videos, listen music, and play games.

SUMMARY

The disclosure provides a volume adjusting method, a device, a mobile terminal and a storage medium, thereby improving the efficiency of volume adjusting and reducing the power consumption of the mobile terminal.

In a first aspect, an embodiment of the disclosure provides a volume adjusting method.
The method includes:
acquiring first audio information corresponding to an audio source when detecting that the audio source of a terminal device is playing;
determining a first audio amplitude of the first audio information;
determining a second audio amplitude of second audio information when the first audio amplitude meets a preset query condition;
determining a corresponding adjustment information when the second audio amplitude meets a preset adjustment condition; and
adjusting a volume of the terminal device according to the adjustment information.

In a second aspect, an embodiment of the disclosure provides a volume adjusting device, which includes:
an acquiring module, configured to acquire first audio information corresponding to an audio source when detecting that the audio source of a terminal device is playing;
an amplitude determining module, configured to determine a first audio amplitude of the first audio information, and to determine a second audio amplitude of second audio information when the first audio amplitude meets a preset query condition;
an adjustment information determining module, configured to determine a corresponding adjustment information when the second audio amplitude meets a preset adjustment condition; and
an adjusting module, configured to adjust a volume of the terminal device according to the adjustment information.

In a third aspect, an embodiment of the disclosure provides a mobile terminal, which includes a processor, a memory and a program stored in the memory and executable on the processor. The volume adjusting method of the embodiment of the disclosure is performed when executing the program.

In a fourth aspect, an embodiment of the disclosure provides a storage medium including instructions executable by a mobile terminal. The instructions are configured to execute the volume adjusting method of the embodiment of the disclosure when executed by a processor of the mobile terminal.

BRIEF DESCRIPTION OF THE DRAWINGS

Other features, objects, and advantages of the disclosure will be more apparent, by reading the detailed description of non-limiting embodiments with reference to the following drawings.

DETAILED DESCRIPTION

Figure 1:
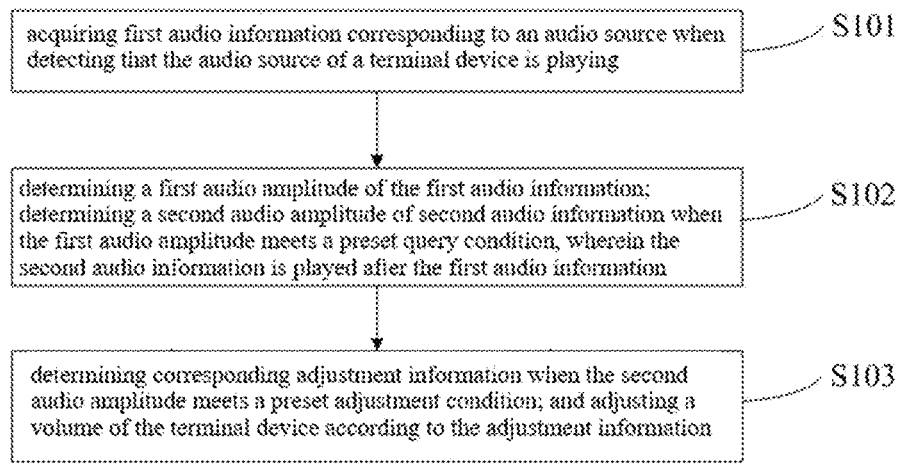
FIG. 1 is a flowchart of a volume adjusting method according to an embodiment of the disclosure.

The disclosure will be further described in detail below with reference to the accompanying drawings and embodiments. It can be understood that the specific embodiments described herein are used to explain but not to limit the disclosure. It should also be noted that, for convenience of description, just the structures related to the disclosure are shown in the drawings, but not all the structures.

FIG. 1 is a flowchart of a volume adjusting method according to an embodiment of the disclosure. The embodiment is suitable for adjusting the volume of a terminal device when playing an audio source. The method may be performed by the terminal device provided by the disclosure. A volume adjusting device of the terminal device may be implemented by software and/or hardware. As illustrated in FIG. 1, the specific solution provided by the embodiment is as follows.

Step S101, when detecting that a terminal device is playing an audio source, first audio information corresponding to the audio source is obtained.

The terminal device can play the audio source via an installed third-party application or a system pre-installed audio and video playback software, and the play of the audio source mainly includes steps of acquiring, decoding and outputting the audio source file. The audio source may include just one audio and correspond to one audio source file. The audio source may include a list of audios, that is, the audio source may include a number of audios which is playing or waited to be played, and correspond to a number of audio source files. Exemplarily, the acquired audio source file may be a multicast stream received over the network, or an audio and video file stored locally on the terminal device. After acquiring the audio source file, it is loaded into a memory buffer, and then the audio source file in the memory buffer is decoded. Before the decoding, if the audio source file contains video data, it is necessary to separate the audio data and the video data therefrom, and input the separated audio data to an audio decoder. The audio decoder is mainly configured to read the audio data in the memory buffer, obtain digital audio signals, and convert the digital audio signals into analog audio signals. A playback component of the terminal device performs audio playback according to the analog audio signals. In one embodiment, when monitoring that an audio source playback event is triggered, it is determined that the terminal device starts to play the audio source. The triggered event may be that a playback button displayed on a touch screen is detected to be pressed, or that the playback component of the terminal device, such as a speaker, starts to play sound. As such it is determined that the terminal device is playing the audio source.

When it is detected that the terminal device is playing the audio source, the first audio information of the audio source is acquired. In one embodiment, the digital audio signals decoded by the audio decoder may be sampled to determine the first audio information corresponding to the audio source. In another embodiment, an original file of the currently playing audio source may be obtained, and the first audio information corresponding to the audio source may be determined by analyzing the original file. In still another embodiment, taking the Android system as an example, the first audio information corresponding to the audio source may be obtained through the android.media.MediaRecorder Class or the android.media.AudioRecord Class.

The first audio information may be all audio information corresponding to one audio source. For example, when it is detected that the audio source played by the terminal device is a song, the audio information corresponding to the song may be used as the first audio information. At this time, a subsequent second audio information is the audio information corresponding to another audio source (e.g., a movie, a chat voice). The first audio information may also be one of a plurality of audio information included in an audio source system, and the currently played audio information is used as the first audio information. For example, when a user uses WeChat for a voice chat, the user can interact with the contacts for voice chat, that is, voice information can be sent at different times at intervals, and each voice information can be regarded as one audio information.

Step S102, a first audio amplitude of the first audio information is determined, and a second audio amplitude of second audio information is determined when the first audio amplitude meets a preset query condition.

The second audio information is the content played after the first audio information.

Amplitude refers to the maximum distance from an original position during a vibration of an object. The loudness of the sound heard by the human ear is related to the amplitude of the sound source. The larger the amplitude, the stronger the loudness. In one embodiment, the acquired audio information can be decoded by the audio decoder to obtain digital audio signals, and the digital audio signals can be sampled to obtain amplitude information during a preset time period T. The amplitude information may be composed of multiple amplitude values, an amplitude curve of the audio source played during the preset time period can be correspondingly determined according to the obtained multiple amplitude values, that is, the first audio amplitude corresponding to the first audio information can be determined. In another embodiment, taking the Android system as an example, the first audio information can be obtained by performing amplitude extraction on the acquired first audio information via the android. media.MediaRecorder Class or the android.media.AudioRecord Class. In an additional embodiment, when the audio information acquired in step S101 is an original file corresponding to the sound source, the original file may be parsed to obtain the corresponding first audio amplitude.

In one embodiment, when detecting the playback of the sound source, the first audio amplitude is determined every preset time (such as 1 s, 3 s, or 10 s), or the first audio amplitude is obtained by determining the amplitude of each frame of the audio information in real time. Exemplarily, when the playback of the audio source is detected, the audio source file is parsed to obtain a sequence of first audio frames, and a corresponding first audio amplitude is determined according to each frame of the sequence of the first audio frames.

Correspondingly, the manner of determining the second audio amplitude can be referred to that of determining the first audio amplitude, and details are not described herein again.

In one embodiment, the first audio amplitude satisfies the preset query condition includes: an amplitude adjustment coefficient of the first audio amplitude is smaller than a preset adjustment coefficient, or the first audio amplitude is larger than a first preset amplitude threshold. In other words, when the amplitude adjustment coefficient of the first audio amplitude is equal to or larger than the preset adjustment coefficient, or when the first audio amplitude is equal to or less than the first preset amplitude threshold, it is determined that the first audio amplitude fails to satisfy the preset query condition. Exemplarily, the preset adjustment coefficient may be 1.2 or 0.8, and the first preset amplitude threshold may be −5 db. The amplitude adjustment coefficient is used to adjust the audio amplitude. Exemplarily, when the audio amplitude is relatively small, an amplitude adjustment coefficient larger than 1 can be given to increase its amplitude, thereby increasing the volume. Correspondingly, when the audio amplitude is relatively large, an amplitude adjustment coefficient less than 1 can be given to reduce its amplitude, thereby decreasing the volume when playing.

Step S103, when the second audio amplitude meets a preset adjustment condition, a corresponding adjustment information is determined; and a volume of the terminal device is adjusted according to the adjustment information.

The second audio amplitude meets the preset adjustment condition includes: the second audio amplitude is smaller than a second preset amplitude threshold. In other words, when the second audio amplitude is equal to or larger than the second preset amplitude threshold, it is determined that the second audio amplitude fails to meet the preset adjustment condition. Exemplarily, the second preset amplitude threshold may be −20 db. In one embodiment, the second audio amplitude is smaller than the second preset amplitude threshold includes: a peak of the second audio amplitude is smaller than the second preset amplitude threshold, or an average value of the second audio amplitude is smaller than the second preset amplitude threshold.

Figure 2:
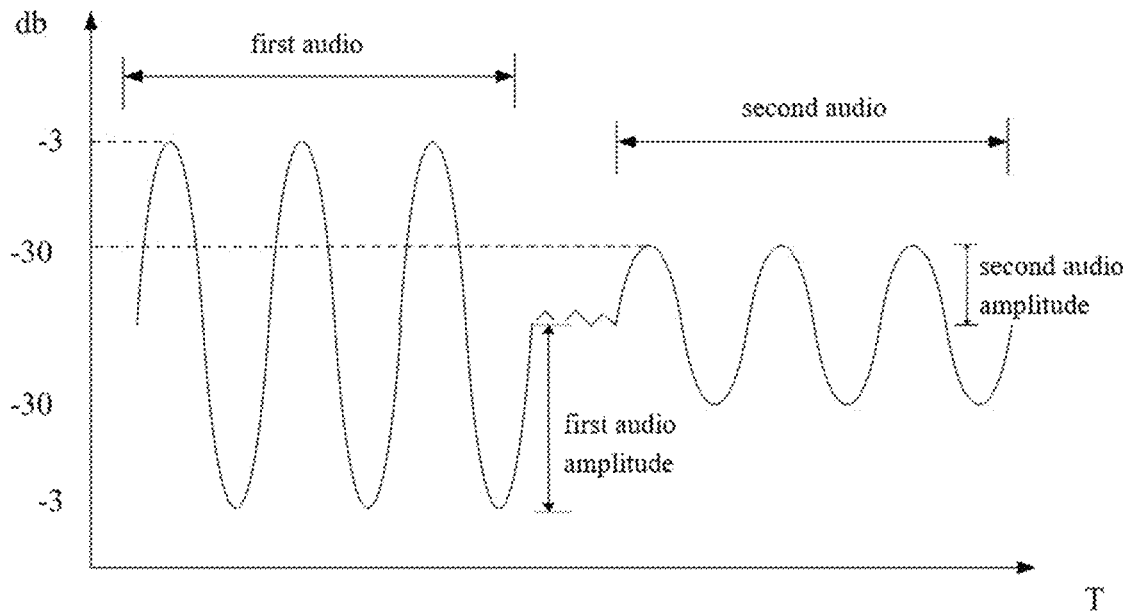
FIG. 2 is a schematic diagram showing an amplitude curve corresponding to a first audio amplitude and a second audio amplitude of an audio source according to an embodiment of the disclosure.

A possible embodiment is illustrated in FIG. 2, FIG. 2 is a schematic diagram showing an amplitude curve corresponding to a first audio amplitude and a second audio amplitude of an audio source according to an embodiment of the disclosure. The first audio amplitude is relatively large, its peak is −3 db, and a peak of the second audio amplitude is −30 db. If according to the pre-assigned amplitude adjustment coefficients (in order to ensure the output volume of the sound source is not too loud or too small, a portion of the sound source with a relatively large amplitude corresponds to a relatively small amplitude adjustment coefficient, and a portion of the sound source with a relatively small amplitude corresponds to a relatively large amplitude adjustment coefficient; for example, the amplitude adjustment coefficient corresponding to the first audio amplitude is 1, meanwhile the amplitude adjustment coefficient corresponding to the second audio amplitude is 2), after the first audio amplitude is played, the adjustment corresponding to the second audio amplitude cannot achieve the adjusting function because the previous first audio amplitude is relatively large and assigned a relatively small amplitude adjustment coefficient. At this time, the corresponding adjustment information is determined, and the volume of the terminal device is adjusted according to the adjustment information. The volume of the terminal device can be adjusted by adjusting a system volume of the terminal device or adjusting the second audio amplitude, thereby increasing the volume when the second audio information is output.

It can be known from the foregoing that when the amplitude of the first audio information is detected to be relatively large and the amplitude of the subsequent second audio information is relatively small, the amplitude of the second audio information or the system volume of the terminal is adjusted to increase the volume when outputting the second audio information, thereby avoiding the problem that the volume is too small to hear the content clearly. It is not needed for the user to manually adjust the volume, which improves the volume adjustment efficiency and makes the sense to meet the user requirements.

Figure 3:
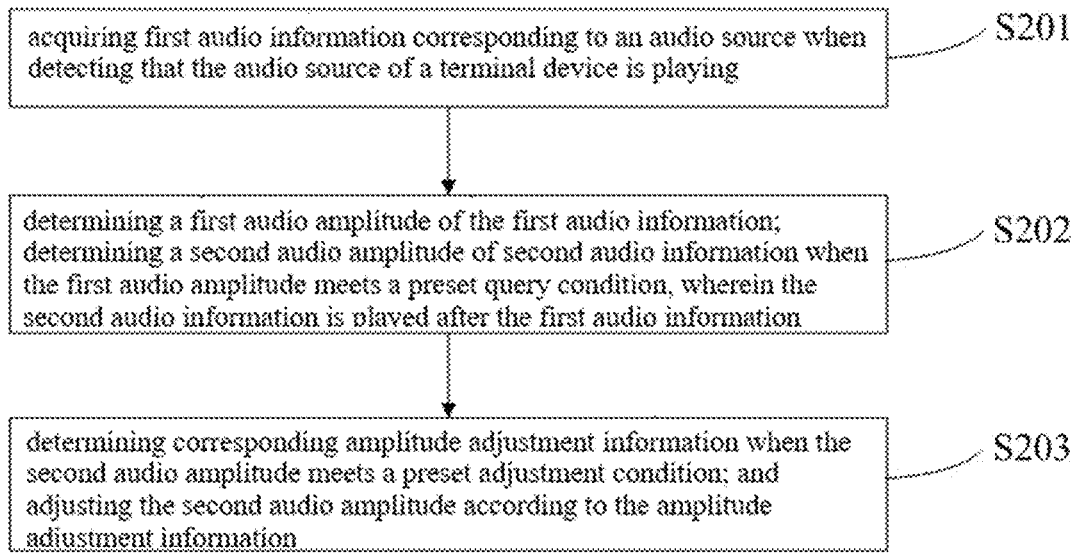
FIG. 3 is a flowchart of another volume adjusting method according to an embodiment of the disclosure.

FIG. 3 is a flowchart of another volume adjusting method according to an embodiment of the disclosure. Optionally, determining corresponding adjustment information and adjusting a volume of a terminal device according to the adjustment information includes: determining corresponding amplitude adjustment information, and adjusting a second audio amplitude according to the corresponding amplitude adjustment information. As illustrated in FIG. 3, the technical solution is as follows.

Step S201, when detecting that the terminal device is playing an audio source, first audio information corresponding to the audio source is obtained.

Step S202, a first audio amplitude of the first audio information is determined, when the first audio amplitude meets a preset query condition, the second audio amplitude of second audio information is determined.

Step S203, when the second audio amplitude meets a preset adjustment condition, corresponding amplitude adjustment information is determined, and the second audio amplitude is adjusted according to the corresponding amplitude adjustment information.

In one embodiment, the operation of determining the corresponding amplitude adjustment information includes: determining the corresponding amplitude adjustment information according to the magnitude of the second audio amplitude and an amplitude adjustment mapping table. The relationship between the magnitudes of the second audio amplitude and corresponding amplitude adjustment coefficients in an exemplary amplitude adjustment mapping table is as follows:

TABLE 1

| amplitude | adjustment coefficient |
|---|---|
| −20 db to −30 db | 1.7 |
| −30 db to −40 db | 1.8 |
| −40 db to −50 db | 1.9 |

In one embodiment, the process of adjusting the second audio amplitude by using the amplitude adjustment coefficient may be: obtaining audio information by analyzing the relevant audio source file, modifying the data representing the amplitude information in the obtained audio information, packaging the data after the modification, thereby the second audio amplitude has been increased or decreased accordingly when buffered to the corresponding audio source file so it is played. The process of adjusting the second audio amplitude by using the amplitude adjustment coefficient also may be: obtaining the second audio amplitude by analyzing digital audio signals, which are obtained by decoding the second audio information during the decoding process when playing the second audio information, changing the amplitude by multiplying the amplitude data corresponding to the second audio amplitude by the corresponding amplitude adjustment coefficient, thereby adjusting the volume. Thus, the volume of the audio source can be adjusted without changing the original volume of the terminal device system. The adjusting process can be performed before the second audio information file enters the buffer, to reduce the loading of playback, the adjusting process also can be performed aimed to the second audio information content in the buffer, to improve the adjusting efficiency.

Figure 4:
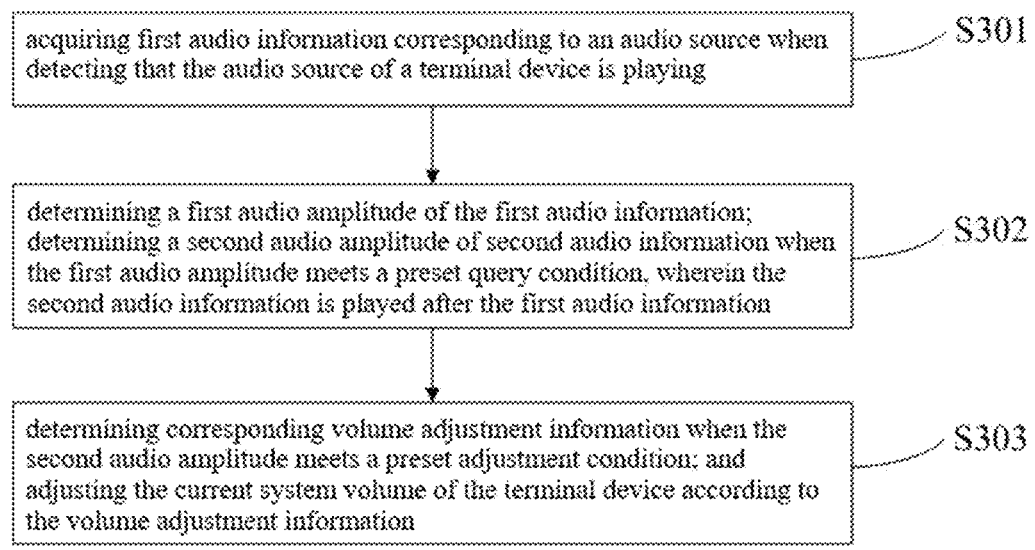
FIG. 4 is a flowchart of still another volume adjusting method according to an embodiment of the disclosure.

FIG. 4 is a flowchart of still another volume adjusting method according to an embodiment of the disclosure. Optionally, adjusting a volume of the terminal device according to the adjustment information includes: determining the corresponding volume adjustment information, and adjusting the current system volume of the terminal device according to the volume adjustment information. As illustrated in FIG. 4, the technical solution is as follows.

Step S301, when detecting that the terminal device is playing an audio source, first audio information corresponding to the audio source is obtained.

Step S302, a first audio amplitude of the first audio information is determined, when the first audio amplitude meets a preset query condition, the second audio amplitude of second audio information is determined.

Step S303, when the second audio amplitude meets a preset adjustment condition, corresponding amplitude adjustment information is determined, and the current system volume of the terminal device is adjusted according to the volume adjustment information.

In one embodiment, the operation of determining the corresponding volume adjustment information, and adjusting the current system volume of the terminal device according to the volume adjustment information includes: determining a corresponding target volume value or a corresponding volume change value, and adjusting the current system volume of the terminal device according to the target volume value or the volume change value.

In one embodiment, the volume adjustment information is the corresponding target volume value. Exemplarily, the volume of the terminal device is divided into 18 adjustable levels from mute to the maximum volume, each level corresponds to a volume value. The target volume value corresponding to the volume adjustment information may be 14 or 15, and the volume value is correspondingly increased to 14 or 15 during the process of adjusting the volume of the terminal device system. Optionally, before adjusting the volume by using the target volume value, and the target volume value corresponding to the volume increase information may be 14 or 15. During the adjustment, the volume value is correspondingly increased to 14 or 15. Optionally, before adjusting the volume by using the target volume value, the method further includes: determining a playback time of the second audio information, and the system volume of the terminal device is adjusted according to the target volume value of the volume adjustment information, when the playback time is longer than a preset time such as 30 s. Thus, the volume adjustment efficiency is improved and the energy consumption of the terminal device is reduced.

In one embodiment, the volume adjustment information is the corresponding volume change value. Exemplarily, the volume of the terminal device is divided into 18 adjustable levels from mute to the maximum volume, each level corresponds to a volume value. The volume change value is 3, for example, the current volume of the terminal device is 10, when it is necessary to increase the volume information, increase 3 on the basis of the current volume value, i.e. use the 13 volume value to play. Optionally, before adjusting the volume by using the volume change value, the method further includes: determining a playback time of the second audio information, and the system volume of the terminal device is adjusted according to the volume change value of the volume adjustment information, when the playback time is longer than a preset time such as 30 s. Thus, the volume adjustment efficiency is improved and the energy consumption of the terminal device is reduced.

Figure 5:
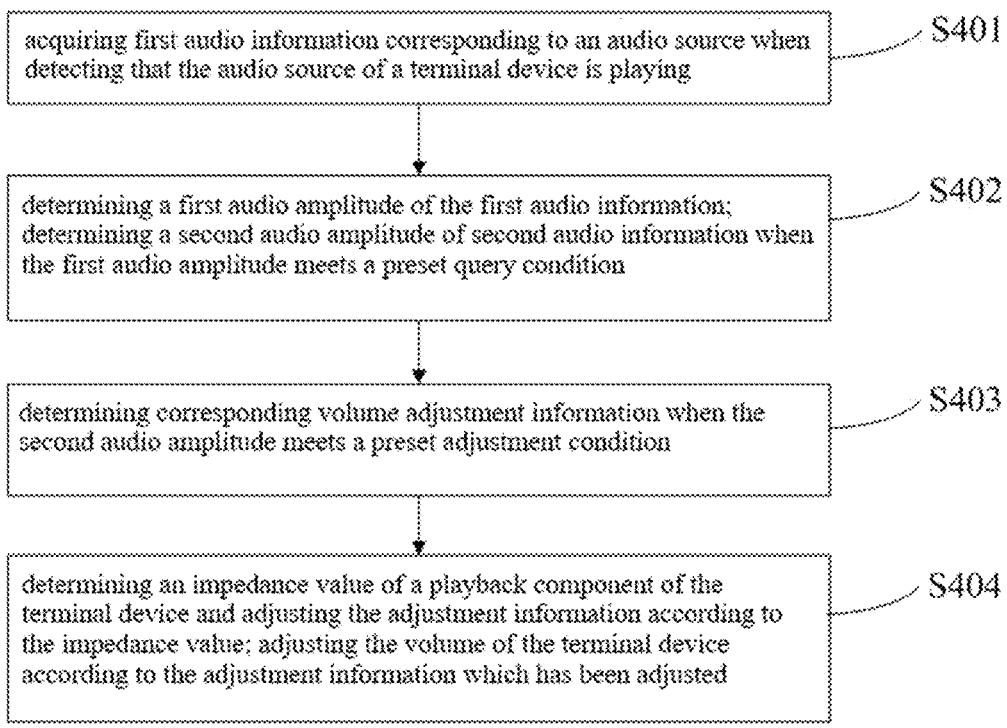
FIG. 5 is a flowchart of still another volume adjusting method according to an embodiment of the disclosure.

FIG. 5 is a flowchart of still another volume adjusting method according to an embodiment of the disclosure. Optionally, before adjusting a volume of the terminal device according to the adjustment information, the method further includes: determining an impedance value of a playback component of the terminal device, adjusting the adjustment information according to the impedance value; correspondingly, adjusting the volume of the terminal device according to the adjustment information includes: adjusting the volume of the terminal device according to the adjustment information which has been adjusted.

As illustrated in FIG. 5, the technical solution is as follows.

Step S401, when detecting that the terminal device is playing an audio source, first audio information corresponding to the audio source is obtained.

Step S402, a first audio amplitude of the first audio information is determined, when the first audio amplitude meets a preset query condition, the second audio amplitude of second audio information is determined.

Step S403, when the second audio amplitude meets a preset adjustment condition, corresponding volume adjustment information is determined.

Step S404, determining an impedance value of a playback component of the terminal device, adjusting the adjustment information according to the impedance value, and adjusting the volume of the terminal device according to the adjustment information which has been adjusted.

In one embodiment, the impedance value of the playback component (e.g. a speaker) installed in the terminal device can be detected through a power amplifier chip, also can be detected by a physical manner. Exemplarily, the larger the impedance value is, the larger the corresponding adjustment of the volume adjustment information is. Specifically, assuming that a nominal impedance value of the playback component is x, the obtained impedance value is 1.2× by detecting, based on the determined adjustment information, the corresponding amplitude adjustment information, the target volume value or volume change value in the adjustment information may be multiplied by 1.2 as the adjustment information which has been adjusted.

It can be known from the above that, in the process of adjusting the amplitude of the sound source, the impedance value of the playback component is introduced as one of the parameters for determining the volume adjustment information, which avoids the problem that the impedance of the playback component becomes higher and higher with the increase of the playback time and thus affects the volume in the normal playback process. The adjusted volume can meet the requirements of the user better, and the volume adjustment effect can be improved further.

Figure 6:
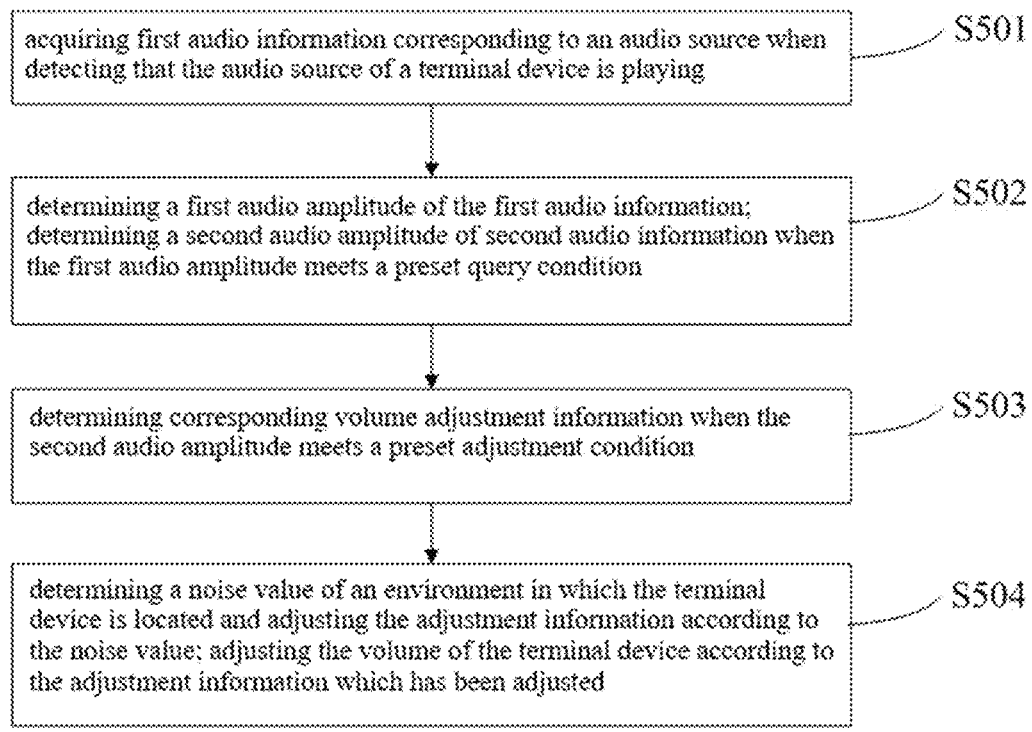
FIG. 6 is a flowchart of still another volume adjusting method according to an embodiment of the disclosure.

FIG. 6 is a flowchart of still another volume adjusting method according to an embodiment of the disclosure. Optionally, before adjusting a volume of the terminal device according to the adjustment information, the method further includes: determining a noise value in an environment in which the terminal device is located, and adjusting the adjustment information according to the noise value; correspondingly, adjusting the volume of the terminal device according to the adjustment information includes: adjusting the volume of the terminal device according to the adjustment information which has been adjusted.

As illustrated in FIG. 6, the technical solution is as follows.

Step S501, when detecting that the terminal device is playing an audio source, first audio information corresponding to the audio source is obtained.

Step S502, a first audio amplitude of the first audio information is determined, when the first audio amplitude meets a preset query condition, the second audio amplitude of second audio information is determined.

Step S503, when the second audio amplitude meets a preset adjustment condition, corresponding volume adjustment information is determined.

Step S504, determining a noise value of an environment in which the terminal device is located, adjusting the adjustment information according to the noise value, and adjusting the volume of the terminal device according to the adjustment information which has been adjusted.

In one embodiment, the noise of the current environment can be collected through a microphone installed on the terminal device to determine the corresponding noise value. Exemplarily, the larger the noise value is, the larger the corresponding adjustment of the volume adjustment information is. Specifically, assuming that the noise value of the terminal device in a quiet environment is y, when the terminal device is in an outdoor or a noisy environment, the determined noise value is 1.5y, based on the determined adjustment information, the amplitude adjustment information, the target volume value, or the volume change value in the adjustment information may be multiplied by 1.5 as the adjustment information which has been adjusted. It should be noted that the adjustment information can also be adjusted together with the impedance value and the noise value.

It can be known from the above that, in the process of adjusting the amplitude of the sound source, the influence of noise on the volume of the terminal device is considered, and the determined noise value is introduced as one of the parameters for determining the volume adjustment information, so that the adjusted volume is more in line with user needs and the volume adjustment effect is further improved.

Figure 7:
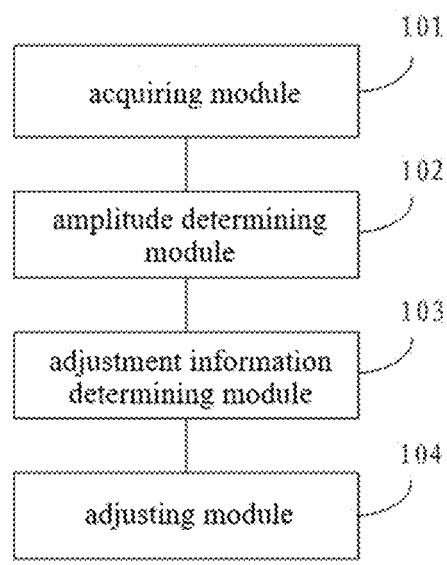
FIG. 7 is a structural block diagram of a volume adjusting device according to an embodiment of the disclosure.

FIG. 7 is a structural block diagram of a volume adjusting device according to an embodiment of the disclosure. The device is configured to execute the volume adjusting method in the foregoing embodiments, and is provided with corresponding function modules and beneficial effects for executing the method. As illustrated in FIG. 7, the device specifically includes an acquiring module 101, an amplitude determining module 102, an adjustment information determining module 103, and an adjusting module 104.

The acquiring module 101 is configured to acquire first audio information corresponding to an audio source when detecting that a terminal device is playing the audio source.

The terminal device can play the audio source via an installed third-party application or a system pre-installed audio and video playback software, and the play of the audio source mainly includes steps of acquiring, decoding and outputting the audio source file. Exemplarily, the acquired audio source file may be a multicast stream received over the network, or an audio and video file stored locally on the terminal device. After acquiring the audio source file, it is loaded into a memory buffer, and then the audio source file in the memory buffer is decoded. Before the decoding, if the audio source file contains video data, it is necessary to separate the audio data and the video data therefrom, and input the separated audio data to an audio decoder. The audio decoder is mainly configured to read the audio data in the memory buffer, obtain digital audio signals, and convert the digital audio signals into analog audio signals. A playback component of the terminal device performs audio playback according to the analog audio signals. In one embodiment, when monitoring that an audio source playback event is triggered, it is determined that the terminal device starts to play the audio source. The triggered event may be that a playback button displayed on a touch screen is detected to be pressed, or that the playback component of the terminal device, such as a speaker, starts to play sound. As such it is determined that the terminal device is playing the audio source.

When it is detected that the terminal device is playing the audio source, the first audio information of the audio source is acquired. In one embodiment, the digital audio signals decoded by the audio decoder may be sampled to determine the first audio information corresponding to the audio source. In another embodiment, an original file of the currently playing audio source may be obtained, and the first audio information corresponding to the audio source may be determined by analyzing the original file. In still another embodiment, taking the Android system as an example, the first audio information corresponding to the audio source may be obtained through the android.media.MediaRecorder Class or the android.media.AudioRecord Class.

The first audio information may be all audio information corresponding to one audio source. For example, when it is detected that the audio source played by the terminal device is a song, the audio information corresponding to the song may be used as the first audio information. At this time, a subsequent second audio information is the audio information corresponding to another audio source (e.g., a movie, a chat voice). The first audio information may also be one of a plurality of audio information included in an audio source system, and the currently played audio information is used as the first audio information. For example, when a user uses WeChat for a voice chat, the user can interact with the contacts for voice chat, that is, voice information can be sent at different times at intervals, and each voice information can be regarded as one audio information.

The amplitude determining module 102 is configured to determine a first audio amplitude of the first audio information, and determine a second audio amplitude of second audio information when the first audio amplitude meets a preset query condition, wherein the second audio information is played after the first audio information.

The second audio information is the content played after the first audio information.

Amplitude refers to the maximum distance from an original position during a vibration of an object. The loudness of the sound heard by the human ear is related to the amplitude of the sound source. The larger the amplitude, the stronger the loudness. In one embodiment, the acquired audio information can be decoded by the audio decoder to obtain digital audio signals, and the digital audio signals can be sampled to obtain amplitude information during a preset time period T. The amplitude information may be composed of multiple amplitude values, an amplitude curve of the audio source played during the preset time period can be correspondingly determined according to the obtained multiple amplitude values, that is, the first audio amplitude corresponding to the first audio information can be determined. In another embodiment, taking the Android system as an example, the first audio information can be obtained by performing amplitude extraction on the acquired first audio information via the android.media.MediaRecorder Class or the android.media.AudioRecord Class. In an additional embodiment, when the audio information acquired in step S101 is an original file corresponding to the sound source, the original file may be parsed to obtain the corresponding first audio amplitude.

In one embodiment, when detecting the playback of the sound source, the first audio amplitude is determined every preset time (such as 1 s, 3 s, or 10 s), or the first audio amplitude is obtained by determining the amplitude of each frame of the audio information in real time. Exemplarily, when the playback of the audio source is detected, the audio source file is parsed to obtain a sequence of first audio frames, and a corresponding first audio amplitude is determined according to each frame of the sequence of the first audio frames.

Correspondingly, the manner of determining the second audio amplitude can be referred to that of determining the first audio amplitude, and details are not described herein again.

In one embodiment, the first audio amplitude satisfies the preset query condition includes: an amplitude adjustment coefficient of the first audio amplitude is smaller than a preset adjustment coefficient, or the first audio amplitude is larger than a first preset amplitude threshold. Exemplarily, the preset adjustment coefficient may be 1.2 or 0.8, and the first preset amplitude threshold may be −5 db. The amplitude adjustment coefficient is used to adjust the audio amplitude. Exemplarily, when the audio amplitude is relatively small, an amplitude adjustment coefficient can be given to increase its amplitude, thereby increasing the volume. Correspondingly, when the audio amplitude is relatively large, an amplitude adjustment coefficient less than 1 can be given to reduce its amplitude, thereby decreasing the volume when playing.

The adjustment information determining module 103 is configured to determine a corresponding adjustment information, when the second audio amplitude meets a preset adjustment condition.

The second audio amplitude meets the preset adjustment condition includes: the second audio amplitude is smaller than a second preset amplitude threshold. Exemplarily, the second preset amplitude threshold may be −20 db. In one embodiment, the second audio amplitude is smaller than the second preset amplitude threshold includes: a peak of the second audio amplitude is smaller than the second preset amplitude threshold, or an average value of the second audio amplitude is smaller than the second preset amplitude threshold.

The adjusting module 104 is configured to adjust a volume of the terminal device according to the adjustment information.

The technical solution provided in the embodiment includes technical features of acquiring first audio information corresponding to an audio source when detecting that the audio source of a terminal device is playing; determining a first audio amplitude of the first audio information; determining a second audio amplitude of second audio information when the first audio amplitude meets a preset query condition; determining a corresponding adjustment information when the second audio amplitude meets a preset adjustment condition; and adjusting a volume of the terminal device according to the adjustment information. This solution improves the volume adjustment efficiency and reduces the power consumption of the terminal device.

In one embodiment, the first audio amplitude satisfies the preset query condition includes: an amplitude adjustment coefficient of the first audio amplitude is smaller than a preset adjustment coefficient, or the first audio amplitude is larger than a first preset amplitude threshold; correspondingly, the second audio amplitude meets the preset adjustment condition includes: the second audio amplitude is smaller than a second preset amplitude threshold.

In one embodiment, the second audio amplitude is smaller than the second preset amplitude threshold includes: a peak of the second audio amplitude is smaller than the second preset amplitude threshold, or an average value of the second audio amplitude is smaller than the second preset amplitude threshold.

In one embodiment, the adjustment information determining module is specifically configured for determining corresponding amplitude adjustment information; the adjusting module is specifically configured for adjusting the second audio amplitude according to the amplitude adjustment information.

In one embodiment, the adjustment information determining module 103 is specifically configured for determine corresponding amplitude adjustment information according to the second audio amplitude and an amplitude adjustment mapping table.

In one embodiment, the adjustment information determining module 103 is specifically configured for determining corresponding volume adjustment information; the adjusting module 104 is specifically configured for adjusting the current system volume of the terminal device according to the volume adjustment information.

In one embodiment, the adjustment information determining module 103 is specifically configured for determining a corresponding target volume value or a corresponding volume change value; the adjusting module 104 is specifically configured for adjusting the current system volume of the terminal device according to the target volume value or the volume change value.

In one embodiment, the adjustment information determining module 103 is specifically configured for determining an impedance value of a playback component of the terminal device and adjusting the adjustment information according to the impedance value, before adjusting the volume of the terminal device according to the adjustment information; correspondingly, the adjusting module 104 is specifically configured for adjusting the volume of the terminal device according to the adjustment information which has been adjusted.

In one embodiment, the adjustment information determining module 103 is specifically configured for determining a noise value of an environment in which the terminal device is located and adjusting the adjustment information according to the noise value, before adjusting the volume of the terminal device according to the adjustment information; correspondingly, the adjusting module 104 is specifically configured for adjusting the volume of the terminal device according to the adjustment information which has been adjusted.

Figure 8:
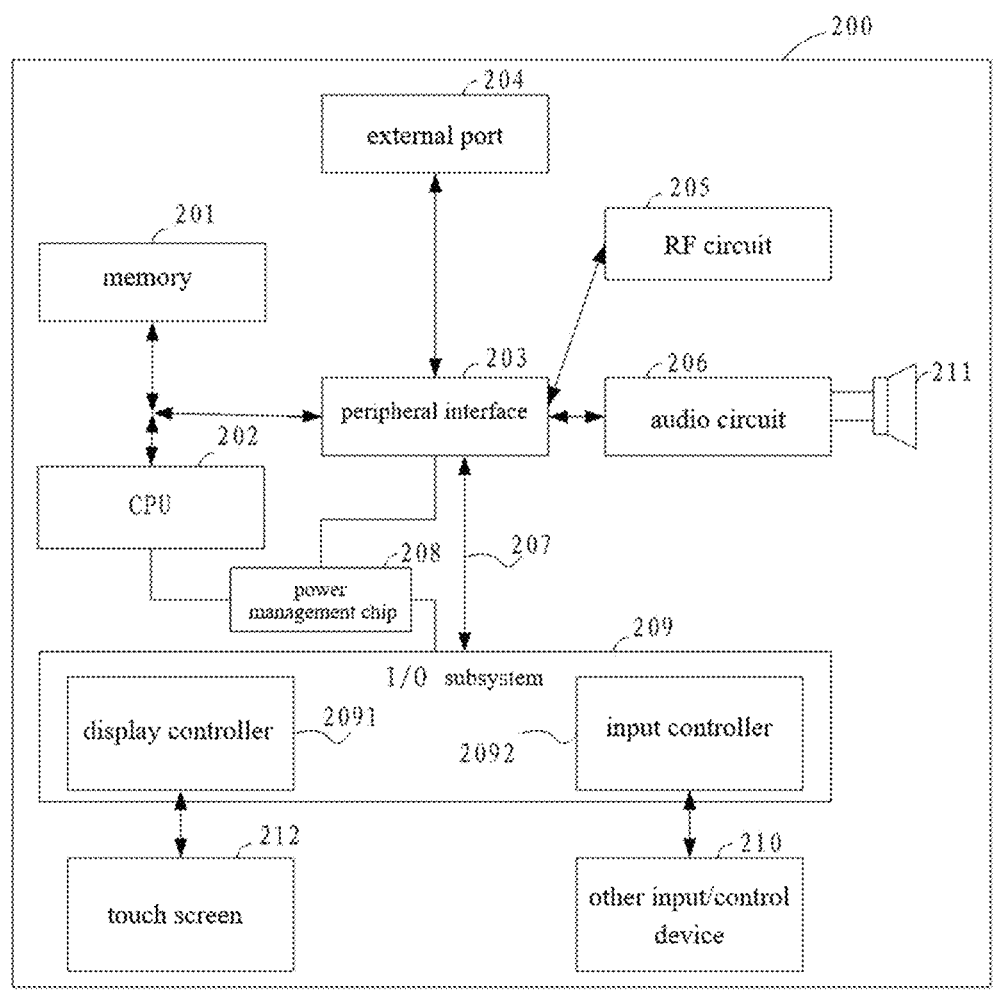
FIG. 8 is a schematic structural diagram of a terminal device according to an embodiment of the disclosure.

An embodiment of the disclosure provides a terminal device on the basis of the foregoing embodiments. FIG. 8 is a schematic structural diagram of a terminal device according to an embodiment of the disclosure. As illustrated in FIG. 8, the terminal device 200 includes a memory 201, a central processing unit (CPU) 202, a peripheral interface 203, a Radio Frequency (RF) circuit 205, an audio circuit 206, a speaker 211, a power management chip 208, and an input/output (I/O) subsystem 209, a touch screen 212, other input/control devices 210, and an external port 204. These components communicate through one or more communication buses or one or more signal lines 207.

It should be understood that the illustrated terminal device 200 is just an example of the terminal device, and the terminal device 200 may have more or fewer components than those shown in the figure, two or more components may be combined, or can have different configurations. The illustrated components can be implemented in hardware, software, or a combination of hardware and software, including one or more signal processing circuits and/or specific integrated circuits.

The terminal device for permission management of multiple applications provided in this embodiment is described in detail below. The terminal device is a smart phone as an example.

The memory 201 can be accessed by the CPU 202, the peripheral interface 203, and the like. The memory 201 can include a high-speed random access memory, and can also include a non-volatile memory such as one or more disk storage devices, flash memory devices, or other volatile solid-state storage devices.

The peripheral interface 203 can connect the input and output peripherals of the device to the CPU 202 and the memory 201.

The I/O subsystem 209 can connect the input/output peripherals of the device, such as the touch screen 212 and the other input/control devices 210, to the peripheral interface 203. The I/O subsystem 209 may include a display controller 2091 and one or more input controllers 2092 for controlling the other input/control devices 210. The one or more input controllers 2092 receive electrical signals from the other input/control devices 210 or send electrical signals to the other input/control devices 210. The other input/control devices 210 may include physical buttons (press buttons, rocker buttons, etc.) a dial, a slide switch, a joystick, a click wheel. It is worth noting that the input controller 2092 can be connected to any of the following: a keyboard, an infrared port, a USB interface, and a pointing device such as a mouse.

The touch screen 212 is an input interface and an output interface between a user terminal and a user, and displays a visual output to the user. The visual output may include graphics, text, icons, videos, and the like.

The display controller 2091 of the I/O subsystem 209 receives electrical signals from the touch screen 212 or sends electrical signals to the touch screen 212. The touch screen 212 detects a touch on the touch screen, and the display controller 2091 converts the detected touch into interaction with a user interface object displayed on the touch screen 212, that is, realizes a human-computer interaction. The user interface object displayed on the touch screen 212 may be icons of a running games, icons connected to corresponding networks, etc. It is worth noting that the device may also include a light mouse, which is an extension of a touch-sensitive surface that does not display the visual output, or an extension of a touch-sensitive surface formed by a touch screen.

The RF circuit 205 is mainly used to establish the communication between a mobile phone and a wireless network (that is, a network side), and realize receiving and sending the data between the mobile phone and the wireless network. For example, receiving and sending text messages, e-mails, and so on. Specifically, the RF circuit 205 receives and sends RF signals. The RF signals are also referred to as electromagnetic signals. The RF circuit 205 converts the electrical signals into the electromagnetic signals, or converts the electromagnetic signals into the electrical signals, and communicates with the communication network and other devices through the electromagnetic signals. The RF circuit 205 may include known circuits for performing these functions, including, but not limited to, antenna systems, RF transceivers, one or more amplifiers, tuners, one or more oscillators, digital signal processors, a COder-DECoder (CODEC) chipset, a Subscriber Identity Module (SIM), etc.

The audio circuit 206 is mainly configured to receive audio data from the peripheral interface 203, convert the audio data into electrical signals, and send the electrical signals to the speaker 211.

The speaker 211 is configured to restore voice signals received by the mobile phone from the wireless network through the RF circuit 205 to sounds and play the sounds to a user.

The power management chip 208 is used for power supply and power management for the hardware connected to the CPU 202, the I/O subsystem, and the peripheral interface.

The terminal device and the volume adjustment device of the terminal device provided in the foregoing embodiments can execute the volume adjustment method for the terminal device provided by any embodiment of the present disclosure, and have corresponding function modules and beneficial effects for executing the method. For technical details not described in detail in the foregoing embodiments, reference may be made to the volume adjusting method provided in any embodiment of the present disclosure.

An embodiment of the present disclosure further provides a storage medium including executable instructions for a terminal device, which are configured to execute a volume adjusting method when executed by a terminal device processor, and the method includes:

acquiring first audio information corresponding to an audio source when detecting that the audio source of a terminal device is playing;

determining a first audio amplitude of the first audio information; determining a second audio amplitude of second audio information when the first audio amplitude meets a preset query condition;

determining a corresponding adjustment information when the second audio amplitude meets a preset adjustment condition; and adjusting a volume of the terminal device according to the adjustment information.

In one embodiment, the first audio amplitude satisfies the preset query condition includes: an amplitude adjustment coefficient of the first audio amplitude is smaller than a preset adjustment coefficient, or the first audio amplitude is larger than a first preset amplitude threshold; correspondingly, the second audio amplitude meets the preset adjustment condition includes: the second audio amplitude is smaller than a second preset amplitude threshold.

In one embodiment, the second audio amplitude is smaller than the second preset amplitude threshold includes: a peak of the second audio amplitude is smaller than the second preset amplitude threshold, or an average value of the second audio amplitude is smaller than the second preset amplitude threshold.

In one embodiment, determining corresponding adjustment information and adjusting the volume of the terminal device according to the adjustment information includes: determining corresponding amplitude adjustment information, and adjusting the second audio amplitude according to the amplitude adjustment information.

In one embodiment, determining the corresponding amplitude adjustment information includes: determining corresponding amplitude adjustment information according to the second audio amplitude and an amplitude adjustment mapping table.

In one embodiment, determining corresponding adjustment information and adjusting the volume of the terminal device according to the adjustment information includes: determining corresponding volume adjustment information, and adjusting the current system volume of the terminal device according to the volume adjustment information.

In one embodiment, adjusting the current system volume of the terminal device according to the volume adjustment information includes: determining a corresponding target volume value or a corresponding volume change value, and adjusting the current system volume of the terminal device according to the target volume value or the volume change value.

In one embodiment, before adjusting the volume of the terminal device according to the adjustment information, the method further includes: determining an impedance value of a playback component of the terminal device and adjusting the adjustment information according to the impedance value; correspondingly, adjusting the volume of the terminal device according to the adjustment information includes: adjusting the volume of the terminal device according to the adjustment information which has been adjusted.

In one embodiment, before adjusting the volume of the terminal device according to the adjustment information, the method further includes: determining a noise value of an environment in which the terminal device is located and adjusting the adjustment information according to the noise value; correspondingly, adjusting the volume of the terminal device according to the adjustment information includes: adjusting the volume of the terminal device according to the adjustment information which has been adjusted.

The storage medium refers to any of various types of memory devices or storage devices. The term "storage medium" is intended to include: an installation media, such as CD-ROM, floppy disks, or magnetic tape devices; a computer system memory or a random access memory such as DRAM, DDR RAM, SRAM, EDO RAM, Rambus RAM, etc; a non-volatile memory, such as a flash memory, a magnetic media (such as hard disk or optical storage); registers or other similar types of memory elements, etc. The storage medium may further include other types of memories or a combination thereof. In addition, the storage medium may be located in a first computer system in which the program is executed, or may be located in a different second computer system connected to the first computer system through a network such as the Internet. The second computer system may provide program instructions to the first computer for execution. The term "storage medium" may include two or more storage media that may reside in different locations, such as in different computer systems connected through a network. The storage medium may store program instructions (for example, embodied as a computer program) executable by one or more processors.

Of course, the storage medium having computer-executable instructions provided in the embodiments of the present disclosure, its computer-executable instructions are not limited to execute the operations of the volume adjusting method described above, and may also execute the operations of any of the volume adjusting method provided by any embodiment of the present disclosure.

Please note that the above are only the preferred embodiments and the applied technical principles of the present disclosure. Those skilled in the art will understand that the present disclosure is not limited to the specific embodiments described herein, and those skilled in the art can make various obvious modifications, adjustments and substitutions without departing from the scope of protection of the present disclosure. Therefore, although the present disclosure has been described detailly via the above embodiments, the present disclosure is not limited to the above embodiments, and without departing from the concept of the present disclosure, it may include more other equivalent embodiments, and the scope of the present disclosure is determined by the appended claims.

What is claimed is:

1. A volume adjusting method, comprising:
   acquiring first audio information corresponding to an audio source when detecting that the audio source of a terminal device is playing;
   determining a first audio amplitude of the first audio information;
   determining a second audio amplitude of second audio information when an amplitude adjustment coefficient of the first audio amplitude is smaller than a preset adjustment coefficient, wherein the second audio information is played after the first audio information;
   determining corresponding adjustment information when a peak of the second audio amplitude is smaller than a second preset amplitude threshold; and
   adjusting a volume of the terminal device according to the adjustment information.

2. The method according to claim 1, wherein determining corresponding adjustment information and adjusting a volume of the terminal device according to the adjustment information comprises:
   determining corresponding amplitude adjustment information, and adjusting the second audio amplitude according to the amplitude adjustment information.

3. The method according to claim 2, wherein determining corresponding amplitude adjustment information comprises:
   determining corresponding amplitude adjustment information according to the second audio amplitude and an amplitude adjustment mapping table.

4. The method according to claim 1, wherein determining corresponding adjustment information and adjusting a volume of the terminal device according to the adjustment information comprises:
   determining corresponding volume adjustment information, and adjusting a current system volume of the terminal device according to the volume adjustment information.

5. The method according to claim 4, wherein determining corresponding volume adjustment information and adjusting the current system volume of the terminal device according to the volume adjustment information comprises:
   determining a corresponding target volume value, and adjusting the current system volume of the terminal device according to the target volume value.

6. The method according to claim 4, wherein determining corresponding volume adjustment information and adjusting the current system volume of the terminal device according to the volume adjustment information comprises:
   determining a corresponding volume change value, and adjusting the current system volume of the terminal device according to the volume change value.

7. The method according to claim 1, before adjusting the volume of the terminal device according to the adjustment information, the method further comprising:
   determining an impedance value of a playback component of the terminal device and adjusting the adjustment information according to the impedance value;
   correspondingly, adjusting the volume of the terminal device according to the adjustment information comprising:
   adjusting the volume of the terminal device according to the adjustment information which has been adjusted.

8. The method according to claim 1, before adjusting the volume of the terminal device according to the adjustment information, the method further comprising:
   determining a noise value of an environment in which the terminal device is located, and adjusting the adjustment information according to the noise value;
   correspondingly, adjusting the volume of the terminal device according to the adjustment information comprising:
   adjusting the volume of the terminal device according to the adjustment information which has been adjusted.

9. The method according to claim 1, wherein a portion of the audio source with a relatively large amplitude corresponds to a relatively small amplitude adjustment coefficient, and a portion of the audio source with a relatively small amplitude corresponds to a relatively large amplitude adjustment coefficient.

10. A volume adjusting method, comprising:
    acquiring a first audio amplitude of a first audio when detecting that a terminal device is playing the first audio;
    determining whether the first audio amplitude meets a first preset condition;
    acquiring a second audio amplitude of a second audio when the first audio amplitude meets the first preset condition, the second audio being played after the first audio;
    determining adjustment information when the second audio amplitude meets a second preset condition;
    determining an impedance value of a playback component of the terminal device, and adjusting the adjustment information according to the impedance value; and
    adjusting a volume of the terminal device according to the adjustment information which has been adjusted.

11. The method according to claim 10, wherein determining whether the first audio amplitude meets a first preset condition comprises:

when the first audio amplitude is larger than a first preset amplitude threshold, determining that the first audio amplitude meets the first preset condition; and when the first audio amplitude is equal to or smaller than the first preset amplitude threshold, determining that the first audio amplitude fails to meet the first preset condition.

12. The method according to claim 11, wherein the second audio amplitude meeting a second preset condition comprises:

when the second audio amplitude being smaller than a second preset amplitude threshold, determining that the second audio amplitude meets the second preset condition; and when the second audio amplitude is equal to or larger than the second preset amplitude threshold, determining that the second audio amplitude fails to meet the second preset condition.

13. The method according to claim 12, wherein determining adjustment information when the second audio amplitude meets a second preset condition comprises:

determining the amplitude adjustment information according to the second audio amplitude and a preset amplitude adjustment mapping table; and wherein adjusting the volume of the terminal device according to the adjustment information comprises:

adjusting the second audio amplitude according to the amplitude adjustment information.

14. The method according to claim 12, wherein determining adjustment information when the second audio amplitude meets a second preset condition comprises:

determining volume adjustment information of a source current system volume of the terminal device according to a corresponding target volume value or a corresponding volume change value; and wherein adjusting the volume of the terminal device according to the adjustment information comprises:

adjusting the current system volume of the terminal device according to the volume adjustment information.

15. The method according to claim 10, before adjusting the volume of the terminal device according to the adjustment information, the method further comprising:

determining a noise value of an environment in which the terminal device is located, and adjusting the adjustment information according to the noise value;

correspondingly, adjusting the volume of the terminal device according to the adjustment information comprising:

adjusting the volume of the terminal device according to the adjustment information which has been adjusted.

16. The method according to claim 10, wherein the determining whether the first audio amplitude meets a first preset condition comprises:

when an amplitude adjustment coefficient of the first audio amplitude is smaller than a first preset adjustment coefficient, determining that the first audio amplitude meets the first preset condition; and when the amplitude adjustment coefficient of the first audio amplitude is equal to or larger than the first preset adjustment coefficient, determining that the first audio amplitude fails to meet the first preset condition.

17. The method according to claim 10, wherein the second audio amplitude meeting a second preset condition comprises:

when a peak of the second audio amplitude is smaller than a second preset amplitude threshold, determining that the second audio amplitude meets the second preset condition; or when an average value of the second audio amplitude is smaller than the second preset amplitude threshold, determining that the second audio amplitude meets the second preset condition.

18. A mobile terminal, comprising a processor and a memory, a program is stored in the memory and executable on the processor, wherein the program, when being executed by the processor, causes the processor to perform operations comprising:

acquiring first audio information corresponding to an audio source of the mobile terminal when detecting that the audio source of the mobile terminal is playing;

determining a first audio amplitude of the first audio information;

determining a second audio amplitude of second audio information in response to determining the first audio amplitude is larger than a first preset amplitude threshold, wherein the second audio information is played after the first audio information;

determining corresponding adjustment information in response to determining the second audio amplitude is smaller than a second preset amplitude threshold, wherein the second preset amplitude threshold is smaller than the first preset amplitude threshold; and adjusting a volume of the mobile terminal according to the adjustment information.

19. The mobile terminal according to claim 18, wherein the determining the second audio amplitude is smaller than a second preset amplitude threshold comprises:

determining a peak of the second audio amplitude is smaller than the second preset amplitude threshold; or determining an average value of the second audio amplitude is smaller than the second preset amplitude threshold.

20. The mobile terminal according to claim 18, wherein before adjusting the volume of the mobile terminal according to the adjustment information, the program, when being executed by the processor, further causes the processor to perform operations comprising:

determining an impedance value of a playback component of the mobile terminal and adjusting the adjustment information according to the impedance value;

correspondingly, adjusting the volume of the mobile terminal according to the adjustment information comprising:

adjusting the volume of the mobile terminal according to the adjustment information which has been adjusted.

* * * * *